(12) United States Patent
Oh et al.

(10) Patent No.: US 8,303,928 B2
(45) Date of Patent: Nov. 6, 2012

(54) FLUORINE-CONTAINING MAGNESIUM OXIDE POWDER PREPARED BY VAPOR PHASE REACTION AND METHOD OF PREPARING THE SAME

(75) Inventors: Seung-min Oh, Incheon (KR); Jong-hoon Byun, Gyeonggi-do (KR); Yoon-gu Hwang, Gyeonggi-do (KR)

(73) Assignee: Daejoo Electronic Materials Co, Ltd. (KR)

( * ) Notice: Subject to any disclaimer, the term of this patent is extended or adjusted under 35 U.S.C. 154(b) by 17 days.

(21) Appl. No.: 13/013,888

(22) Filed: Jan. 26, 2011

(65) Prior Publication Data

US 2011/0117005 A1 May 19, 2011

Related U.S. Application Data

(63) Continuation of application No. 12/601,254, filed as application No. PCT/KR2008/005481 on Sep. 18, 2008, now Pat. No. 7,972,586.

(30) Foreign Application Priority Data

Sep. 21, 2007 (KR) .................. 10-2007-0096503

(51) Int. Cl.
*C01F 5/02* (2006.01)
*C01F 5/14* (2006.01)
*C01F 11/02* (2006.01)
*C01F 5/28* (2006.01)
*C01F 11/22* (2006.01)
*C01D 3/02* (2006.01)
*C01B 13/14* (2006.01)

(52) U.S. Cl. .................. 423/635; 423/490; 423/639

(58) Field of Classification Search .................. 423/490, 423/497, 635, 636, 639
See application file for complete search history.

(56) References Cited

U.S. PATENT DOCUMENTS 4,545,975 A    10/1985   Kobayashi et al.
(Continued)

FOREIGN PATENT DOCUMENTS

JP          2004-182521 A       7/2004
(Continued)

OTHER PUBLICATIONS

International Search Report issued Mar. 25, 2009 in PCT/KR2008/005481.
(Continued)

*Primary Examiner* — Colleen Dunn
*Assistant Examiner* — Anthony J Zimmer
(74) *Attorney, Agent, or Firm* — Swanson & Bratschun, L.L.C.

(57) ABSTRACT

The present invention relates to a fluorine-containing magnesium oxide powder using a vapor phase reaction and a method of preparing the same and more particularly to a fluorine-containing magnesium oxide powder brings about a cathode-luminescence emission having a peak within a wavelength range of 220 to 320 nm upon being excited by electron beams. The present invention provides a fluorine-containing magnesium oxide powder using a vapor phase reaction that sprays fluorine-containing gas and oxygen-containing gas to magnesium vapor, and the purity of magnesium oxide containing fluorine (i.e. the purity of fluorine-containing magnesium oxide) of 0.001 to 2 wt % is at least 98 wt % and a BET specific surface area thereof is 0.1 to 50 $m^2/g$.

2 Claims, 2 Drawing Sheets

U.S. PATENT DOCUMENTS

| | | | |
|---|---|---|---|
| 4,786,490 | A | 11/1988 | Yoshida et al. |
| 5,910,297 | A | 6/1999 | Cicha |
| 2003/0165424 | A1* | 9/2003 | Ramani et al. ............ 423/651 |
| 2010/0166639 | A1 | 7/2010 | Oh et al. |

FOREIGN PATENT DOCUMENTS

| | | |
|---|---|---|
| KR | 102000006661 | 2/2000 |
| KR | 1020000048076 | 7/2000 |
| KR | 10-2007-0083428 | 8/2007 |

OTHER PUBLICATIONS

Machine Translation of KR 10-2007-0083428.

Written Opinion issued Mar. 25, 2009 in PCT/KR2008/005481.

Tamai (2004) Bull. Chem.. Soc, Jpn., 77:1239-1247, "Enhanced Dichlorodifluoromethane Decomposition with Selective Fluorine Absorption by Acidic Fluorinated Magnesium Oxide".

Office Action dated Oct. 21, 2010 in U.S. Appl. No. 12/601,254.

* cited by examiner

FLUORINE-CONTAINING MAGNESIUM OXIDE POWDER PREPARED BY VAPOR PHASE REACTION AND METHOD OF PREPARING THE SAME

RELATED APPLICATIONS

This application is a continuation of U.S. application Ser. No. 12/601,254, filed Nov. 21, 2009, entitled "Fluorine-Containing Magnesium Oxide Powder Prepared by Vapor Phase Reaction and Method of Preparing the Same." U.S. application Ser. No. 12/601,254 is a 35 U.S.C. §371 national phase application of PCT/KR2008/005481, filed Sep. 18, 2008 (WO 2009/038334), which claims the benefit of Korean patent application serial no. 10-2007-0096503, filed Sep. 21, 2007. Each of these applications is specifically incorporated herein by reference in its entirety.

TECHNICAL FIELD

The present invention relates to a fluorine-containing magnesium oxide powder using a vapor phase reaction method and a method of preparing the same, and more particularly to a fluorine-containing magnesium oxide powder causing a cathode-luminescence emission having a peak within a wavelength range of 220 to 320 nm upon being excited by electron beams.

The present invention prepares a fluorine-containing magnesium oxide powder using a vapor phase reaction method that sprays fluorine-containing gas and oxygen-containing gas to magnesium vapor, and the purity of magnesium oxide containing fluorine of 0.001 to 2 wt % is at least 98 wt % (i.e. the purity of fluorine-containing magnesium oxide) and a BET specific surface area thereof is 0.1 to 50 $m^2/g$.

BACKGROUND ART

As a method of preparing a magnesium oxide powder, there have been known a vapor phase reaction method, a method of pyrolysing magnesium hydroxide, and an electro-fusing method. In particular, as a method of preparing a magnesium oxide fine powder, there have been known a vapor phase reaction method and a pyrolysis method of heat-treating a magnesium hydroxide powder.

Magnesium oxide has heat resistance, electric insulating property, or the like, so that it has been widely used for refractory, magnesia cement, catalyst, absorbent, antacid, protective layer for dielectric of PDP, etc. The protective layer for the plasma display panel (PDP) has been largely used for providing improved protection of dielectric and luminance efficiency of phosphor using excellent sputtering resistance and high secondary electron emission coefficient of magnesium oxide by forming a magnesium oxide layer on a dielectric layer. It has been recently reported that luminous efficiency of the PDP is increased and discharge characteristics thereof, such as luminance and discharge voltage, etc. are improved.

Korean patent publication No. 2000-0048076 disclosed a method of improving discharge characteristics by preventing or suppressing generation of a hydroxide and a carbonate of magnesium oxide by forming a fluoride layer on the surface of a magnesium oxide protecting film body. This method has a problem in that a further process of forming the fluoride layer after forming the protective layer is needed.

Korean patent publication No. 2000-0006661 disclosed a method of improving discharge characteristics by applying paste containing magnesium oxide single crystal prepared by a vapor phase reaction method with a screen printing method, an offset method, a dispenser method, an inkjet method, or a roll coat method, etc., when compared with a magnesium oxide layer prepared by a conventional deposition method. However, the aforementioned publication does not concretely disclose how to prepare the magnesium oxide powder.

Also, Korean patent publication No. 2007-0083428 disclosed a method of preparing a fluorine-containing magnesium oxide powder by mixing a magnesium oxide powder with a magnesium fluoride powder or firing a magnesium oxide powder at a temperature of at least 850° C. under a fluorine-containing atmosphere in order to prepare the magnesium oxide powder emitting high-efficient ultraviolet ray. This method has a problem in that a post-processing process of the magnesium oxide powder is further needed and it is difficult to uniformly mix the fluorine and the magnesium oxide powder.

DISCLOSURE OF THE INVENTION

Therefore, the present invention provides a method of preparing a magnesium oxide powder uniformly containing fluorine without needing a post-processing process so as to improving efficiency of a plasma display panel. The fluorine-containing magnesium oxide powder of the present invention enables cathode-luminescence (CL) to be uniquely emitted in a wavelength range of 220 to 320 nm, when compared with a powder free from fluorine.

To achieve the object, the present invention prepares a fluorine-containing magnesium oxide powder that is excited by electron beams to perform cathode-luminescence having a peak within a wavelength range of 220 to 320 nm, and the present invention also prepares a fluorine-containing magnesium oxide powder wherein the purity of magnesium oxide containing fluorine in a range of 0.001 to 2 wt % is at least 98 wt % (however, purity of magnesium oxide is purity of fluorine-containing magnesium oxide) and a BET specific surface area thereof is in a range of 0.1 to 50 $m^2/g$.

The present invention prepares a fluorine-containing magnesium oxide powder by a vapor phase reaction method that sprays fluorine-containing gas and oxygen-containing gas to magnesium vapor in a high-temperature reactor.

In the fluorine-containing magnesium oxide powder of the present invention, the fluorine is in a range of 0.001 to 2 wt %, preferably 0.01 to 1 wt % and the purity of the magnesium oxide is at 98 wt %, preferably at least 99.5 wt %.

Also, in the magnesium oxide powder of the present invention, the BET specific surface area is in a range of 0.1 to 50 $m^2/g$ and a shape of the powder is a single crystal cubic structure or a polycrystalline cubic structure. Also, the magnesium oxide powder of the present invention is excited by electron beams to perform cathode-luminescence in a wavelength range of 220 to 320 nm and 400 to 600 nm.

The present invention leads to a defect in a magnesium oxide crystal structure due to a partial substitution of fluorine with oxygen during a combined process of magnesium metal vapor and oxygen so that the fluorine-containing magnesium oxide powder emits ultraviolet ray in a wavelength range of 220 to 320 nm in addition to in a wavelength range of 400 to 600 nm by the excitation of the electron beams.

A method of preparing a magnesium oxide powder having the aforementioned configuration comprising the steps of: evaporating magnesium metal under an atmosphere in which fluorine and oxygen exist; colliding magnesium gas with fluorine and oxygen containing gas; and preparing fluorine-containing magnesium oxide as particles by cooling it.

As the fluorine-containing gas, fluorine gas, hydrogen fluoride gas, ammonium fluoride, fluorine-containing organic compound, sulfur fluoride ($SF_4$, $SF_6$, $S_2F_{10}$), fluorocarbon ($C_xF_y$, x=1~2, y=1~6), $SbF_4$ or $NF_3$ gas are used, however, compounds containing other type of fluorine can be used.

Preferably, argon or nitrogen gas containing fluorine of 5 to 5,000 ppm sprayed at a flow rate in a range of 1 to 50 l/min as the fluorine-containing gas and oxygen, air, or a mixed gas thereof sprayed at a flow rate in a range of 1 to 50 l/min as the oxygen containing gas are collided with each other. The flow rate of the fluorine-containing gas or the oxygen-containing gas can be controlled according to the size of the reactor. Preferably, the flow rate is increased for the volume of a vapor phase reactor of at least 100 l/min.

An apparatus of preparing a fluorine-containing magnesium oxide powder of the present invention is shown in FIG. 1.

In FIG. 1, a magnesium metal is injected in a magnesium evaporation crucible 3. The crucible 3 is heated at least 800° C., preferably at least 900° C. to melt and evaporate the magnesium metal. Fluorine-containing gas and dilution gas is injected in the magnesium evaporation crucible 3 through a fluorine-containing gas inlet 6. Oxygen-containing gas from an oxygen-containing gas inlet 8 is injected into a mixed gas of magnesium gas and fluorine-containing gas discharged to a reactor body 7. The fluorine content of the prepared fluorine-containing magnesium oxide powder is associated with the concentration of the magnesium metal vapor and the flow rate of the fluorine-containing gas.

DESCRIPTION FOR KEY ELEMENTS IN THE DRAWINGS

Figure 1:
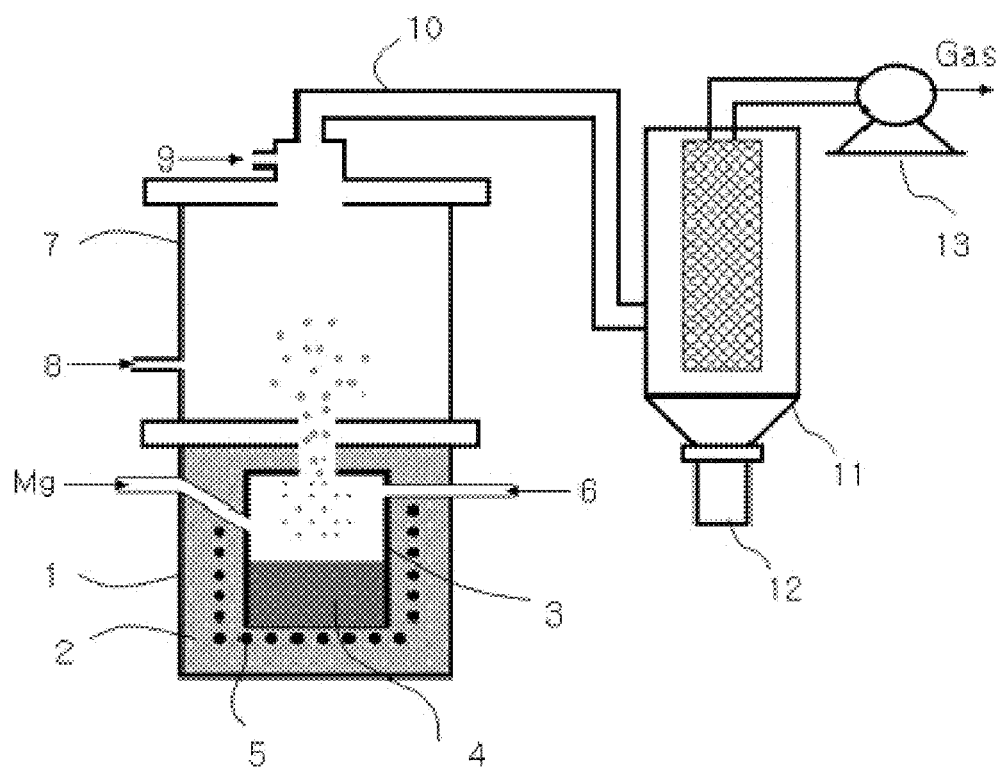
FIG. 1 is a view of an apparatus of preparing a magnesium oxide powder using a vapor phase reaction method according to the present invention.

1: electric furnace body
2: refractory
3: magnesium evaporation crucible
4: magnesium melt
5: heating element
6: fluorine-containing gas inlet
7: reactor body
8: oxygen-containing gas inlet
9: gas inlet for cooling
10: exhaust tube of gas containing powder
11: collector for magnesium oxide powder
12: collection container of magnesium oxide powder
13: blower

BEST MODES FOR CARRYING OUT THE INVENTION

Hereinafter, the present invention will be described in more detail with reference to a comparative example and an Example.

Comparative Examples 1: 1-1~1-3

A magnesium oxide powder was produced using an apparatus of FIG. 1.

A lump of magnesium metal as a raw material was successively injected into a magnesium evaporation crucible 3 every one hour. A temperature of the evaporation crucible was controlled to 1000° C. and argon gas for diluting magnesium vapor was injected into a fluorine-containing gas inlet 6 while changing into 10, 20, 30 l/min. Air was injected with 15 l/min into an oxygen-containing gas inlet 8 and air was injected with 50 l/min into a gas inlet for cooling 9. The generated powder was collected into a collection container at a lower by passing a metal filter of a collector 11. An inner pressure of a reactor was controlled by a blower 13 and the powder was synthesized at a range of 700 to 750 torr under a reduced pressure condition. At this time, the average particle size of the generated powder was reduced to 600, 400, 200 nm with the increase of the flow rate of argon gas. At this time, fluorine was not detected.

Examples 1: 1-1~1-3

A fluorine-containing magnesium oxide powder was produced using the same condition and apparatus as the above Comparative Examples.

A temperature of an evaporator was controlled to 1000° C. Argon gas for diluting magnesium vapor was injected into an oxygen-containing gas inlet 8 while changing into 10, 20, 30 l/min and $SF_6$ gas was injected with 30 ml/min into the fluorine-containing gas inlet 6. Air was injected with 15 l/min into the oxygen-containing gas inlet 8 and air was injected with 50 l/min into the gas inlet for cooling 9. The inner pressure of the reactor was controlled by the blower 13 and the powder was synthesized at a range of 700 to 750 torr under a reduced pressure condition. At this time, as the flow rate of the argon gas increased, the average particle size of the generated magnesium oxide powder was reduced to 600, 400, 200 nm like the Comparative Examples. The fluorine contents in the produced magnesium oxide powder were 0.59, 0.36 and 0.29 wt %.

Figure 2:
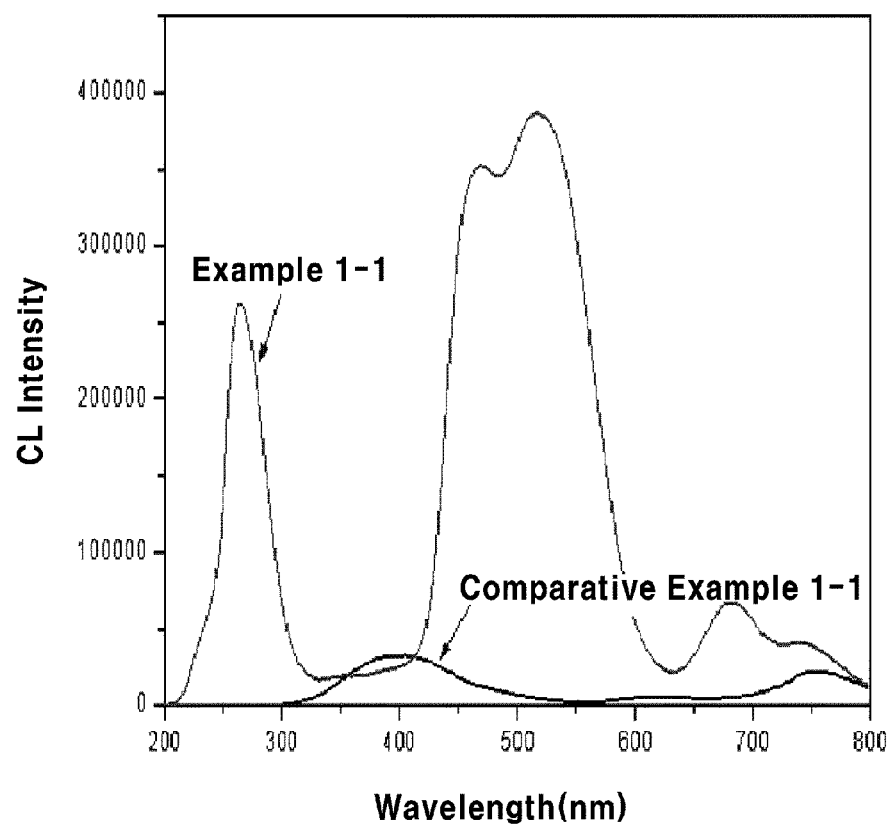
FIG. 2 is a graph showing CL intensity according excitation of ultraviolet ray of magnesium oxide obtained through an Example of the present invention.

Analysis on results of cathode-luminescence (CL) characteristics for the magnesium oxide powder free from fluorine according to Comparative Example 1-1 and the powder containing fluorine of 0.59 wt % according to an Example 1-1 were shown in FIG. 2. It was seen that the magnesium oxide powder free from fluorine (comparative example 1-1) has CL emission having a weak peak within the range from 300 to 500 nm and the fluorine-containing magnesium oxide powder (Example 1-1) has CL emission having the strong peak at 260 nm, 470 nm and 510 nm.

Examples 2: 2-1~2-3

The magnesium oxide powder is produced using the same condition and apparatus as the above Examples 1.

A temperature of an evaporator was controlled to 1000° C. Argon gas for diluting magnesium vapor was injected into an oxygen-containing gas inlet 8 while changing into 10, 20, 30 l/min and $SF_6$ gas was injected with 15 ml/min into the fluorine-containing gas inlet 6. Air was injected with 15 l/min into the oxygen-containing gas inlet 8 and air was injected with 50 l/min into the gas inlet for cooling 9. The inner pressure of the reactor was controlled by the blower 13 and the powder was synthesized at 700 to 750 torr under a reduced pressure condition. At this time, as the flow rate of the argon gas increased, the average particle size of the generated magnesium oxide powder was reduced to 600, 400, 200 nm like the Examples 1, regardless of the flow rate of $SF_6$ gas. The fluorine contents in the produced magnesium oxide powder were 0.16, 0.1 and 0.05 wt %.

Examples 3: 3-1~3-3

The fluorine-containing magnesium oxide powder was produced using the same condition and apparatus as the Examples 1.

A temperature of an evaporator was controlled to 1000° C. Argon gas for diluting magnesium vapor was injected into an oxygen-containing gas inlet 8 while changing into 10, 20, 30 l/min and $SF_6$ gas was injected with 2 ml/min into the fluorine-containing gas inlet 6. Air was injected with 15 l/min into the oxygen-containing gas inlet 8 and air was injected with 50 l/min into the gas inlet for cooling 9. The inner pressure of the reactor was controlled by the blower 13 and the powder was synthesized at 700 to 750 torr under a reduced pressure condition. At this time, as the flow rate of the argon increased, the average particle size of the generated magnesium oxide powder was reduced to 600, 400, 200 nm like the Examples 1~2, regardless of the flow rate of $SF_6$ gas. The fluorine contents in the produced magnesium oxide powder were 0.02, 0.008 and 0.001 wt %.

The experimental conditions and the measurement results of fluorine content, BET specific surface area, and particle size of the obtained magnesium oxide powder of the Comparative Example and Example were indicated in the following table 1.

TABLE 1

| Division | Flow rate of dilution gas [L/min] | $SF_6$ content [ppm] | Fluorine content in powder [ppm] | BET specific surface area [m²/g] | Particle size [nm] |
|---|---|---|---|---|---|
| Comparative Example 1-1 | 10 | 0 | 0 | 2.75 | 609 |
| Comparative Example 1-2 | 20 | 0 | 0 | 3.96 | 426 |
| Comparative Example 1-3 | 30 | 0 | 0 | 7.26 | 231 |
| Example 1-1 | 10 | 3000 | 5890 | 2.69 | 623 |
| Example 1-2 | 20 | 1500 | 3620 | 4.02 | 417 |
| Example 1-3 | 30 | 1000 | 2920 | 7.34 | 228 |
| Example 2-1 | 10 | 1500 | 1650 | 2.74 | 612 |
| Example 2-2 | 20 | 750 | 1030 | 4.10 | 409 |
| Example 2-3 | 30 | 500 | 500 | 7.36 | 228 |
| Example 3-1 | 10 | 20 | 220 | 2.76 | 607 |
| Example 3-2 | 20 | 10 | 80 | 4.09 | 410 |
| Example 3-3 | 30 | 7 | 10 | 7.30 | 230 |

Example 4

The discharge efficiency and luminance of the protective layer prepared by spray-coating the magnesium oxide powder of the Comparative Example 1-1 and the Example 1-1 were measured. A gas mixture of xenon (Xe) and neon (Ne) was used for discharging, and the content of Xe was about 20 wt %. The results are indicated in the following table 2.

TABLE 2

| Division | Fluorine content in powder [ppm] | BET specific surface area [m²/g] | Particle size [nm] | Efficiency [lm/W] | Luminance [cd/m²] |
|---|---|---|---|---|---|
| Comparative Example 1-1 | 0 | 2.75 | 609 | 1.28 | 1340 |
| Example 1-1 | 5890 | 2.69 | 623 | 1.95 | 1650 |

As indicated in the table, when the powder of the Example 1-1 of the present invention is applied on the magnesium oxide deposition layer, the discharge characteristic is improved. It is confirmed that the discharge characteristic is remarkably improved by the ultraviolet ray emitted in the wavelength range of 220 to 320 nm.

INDUSTRIAL APPLICABILITY

According to the present invention, a fluorine-containing magnesium oxide powder is prepared by a single process without needing the post-processing process by injecting a fluorine-containing gas in the process of preparing the magnesium oxide using the vapor phase reaction method. The fluorine-containing magnesium oxide powder has the similar particle diameter and structure to the magnesium oxide powder free from fluorine, in addition, exhibited the cathodeluminescence (CL) characteristic in a range of 220 to 320 nm which does not show in the magnesium oxide powder free from fluorine. As a result of coating the fluorine-containing magnesium oxide powder prepared from the present invention on the dielectric protective layer of the PDP, the discharge characteristics (efficiency, luminance, and jitter) are improved.

Those skilled in the art will appreciate that the conceptions and specific Examples disclosed in the foregoing description may be readily utilized as a basis for modifying or designing other Examples for carrying out the same purposes of the present invention. Those skilled in the art will also appreciate that such equivalent Examples do not depart from the spirit and scope of the invention as set forth in the appended claims.

The invention claimed is:

1. A fluorine-containing magnesium oxide powder prepared by spraying fluorine-containing gas and oxygen-containing gas into magnesium gas, wherein a BET surface area of the magnesium oxide powder is in a range of 0.1 to 50 m²/g and the magnesium oxide powder has a single crystal cubic shape and the magnesium oxide powder causes a cathodeluminescence emission having a peak within a wavelength range of 220 to 320 nm and 400 to 600 nm upon being excited by electron beams.

2. The fluorine-containing magnesium oxide powder as set forth in claim 1, wherein fluorine content in the fluorine-containing magnesium oxide powder is 0.001 to 2 wt % and purity of the magnesium oxide is at least 98 wt %.

* * * * *